United States Patent [19]

Egami et al.

[11] Patent Number: 5,422,185
[45] Date of Patent: Jun. 6, 1995

[54] OLEFIN RESIN-BASED ARTICLES HAVING GAS BARRIER PROPERTIES

[75] Inventors: Masayuki Egami; Tomomi Nakano; Junji Mayumi, all of Mie, Japan

[73] Assignee: Mitsubishi Petrochemical Co., Ltd., Tokyo, Japan

[21] Appl. No.: 42,583

[22] Filed: Apr. 5, 1993

[30] Foreign Application Priority Data

Apr. 14, 1992 [JP] Japan .................................. 4-094129

[51] Int. Cl.⁶ ............................................. B32B 27/36
[52] U.S. Cl. ................................... 428/412; 428/421; 428/476.3; 428/474.4; 428/477.7; 428/458; 428/461; 428/516; 428/517; 428/520
[58] Field of Search ............... 428/516, 517, 483, 421, 428/412, 476.3, 477.7, 474.4, 520, 458, 461

[56] References Cited

U.S. PATENT DOCUMENTS 4,557,946 12/1985 Sacher et al. ........................ 427/41

FOREIGN PATENT DOCUMENTS 0401993 12/1990 European Pat. Off. .
237940 10/1988 Japan .

OTHER PUBLICATIONS

Database WPIL, Derwent Publications Ltd., AN-88-320076, JP-A-63 237 940, Oct. 4, 1988.

Primary Examiner—Edith Buffalow
Attorney, Agent, or Firm—Oblon, Spivak, McClelland, Maier & Neustadt

[57] ABSTRACT

An olefin resin-based article having gas barrier properties, comprising a crystalline olefin copolymer having an inorganic oxide thin film layer formed thereon where the crystalline olefin copolymer comprises ethylene or an α-olefin having from 3 to 12 carbon atoms and a diene and having a diene unit content of from 0.05 to 20 mol %, wherein the article suffers from no reduction in gas barrier properties even when heat or stress is applied during fabrication or use and is useful as a wrapping or packaging material for making pouch-packed foods or IC packages.

11 Claims, No Drawings

OLEFIN RESIN-BASED ARTICLES HAVING GAS BARRIER PROPERTIES

BACKGROUND OF THE INVENTION

1. Field of the Invention

The present invention relates to olefin resin-based articles having excellent gas barrier properties which are useful in packaging applications, such as in the protection of foods and electronic components.

2. Discussion of the Background

Packaging foods, electronic components, and other oxygen sensitive entities in a film or a container which suppresses oxygen permeation has been proposed for protecting the package contents from oxidation, thereby maintaining the quality of the contents for prolonged periods of time.

For example, JP-B-53-12953 (the term "JP-B" as used herein means an "examined published Japanese patent application") discloses a transparent flexible plastic film with low permeability to gases and moisture. This film comprises a flexible plastic film, such as polyethylene terephthalate, cellophane, nylon, polypropylene, or polyethylene, having a thickness of from 5 to 300 μm and have a transparent thin layer of a silicon compound represented by the general formula $Si_xO_y$ (wherein x is 1 or 2; and y is 0, 1, 2 or 3) formed on at least one side thereof to a thickness of from 100 to 3,000 Å.

JP-A-63-237940 (the term "JP-A" as used herein means an "unexamined published Japanese patent application") discloses a transparent film having gas barrier properties comprising the above-mentioned flexible plastic film and having a metal oxide layer comprising an oxide of at least one of the following elements In, Sn, Zn, Zr or Ti formed on at least one side thereof by sputtering. Additionally a transparent heat-sealable resin film is coated thereon.

When a film material made of a polar resin, such as polyethylene terephthalate, nylon or cellophane, is used in the above process, sufficient adhesion to an inorganic oxide film and satisfactory gas barrier properties are obtained.

However, when the above-mentioned inorganic oxide is deposited on the surface of a resin-based article comprising a non-polar resin, the inorganic oxide layer tends to become detached from the non-polar resin relatively easily, upon the application of external stress or heat to the molded article. This detachment is primarily due to inadequate adhesion between the non-polar resin-based article and the deposited inorganic oxide. This situation occurs particularly in cases where a heat sealable layer is laminated on the oxide-deposited non-polar resin molded article, when the article is used, when the laminated article (having a heat sealable layer) is fabricated into final form for bag making a cover sealing, when the container is filled, or when the container and contents are sterilized, such as in the production of pouch-packed foods. When detachment of the oxide layer occurs, the gas permeability increases and the practical utility of the article is severely decreased.

Therefore, it is desirable to provide a resin-based article having good gas barrier properties, which does not undergo detachment of the inorganic oxide layer from the resin-based article and thus retains its gas barrier properties during fabrication and use.

SUMMARY OF THE INVENTION

Accordingly, one object of the present invention is to provide a resin-based article having good gas barrier properties comprising a polyolefin resin-based article and an inorganic oxide deposited thereon, wherein, the inorganic oxide deposit is prevented from detachment during fabrication or use, thereby retaining good gas barrier properties.

A further object of the present invention is to provide an olefin resin-based article with improved gas barrier properties comprised of a crystalline olefin copolymer having an inorganic oxide thin layer deposited thereon, and a further layer of a thermoplastic resin laminated or coated thereon.

These and other objects of the present invention have been satisfied by the discovery of an olefin resin-based article having gas barrier properties comprising a crystalline olefin copolymer having formed thereon an inorganic oxide thin layer, wherein the crystalline olefin copolymer comprises repeat units obtained from ethylene or an α-olefin having from 3 to 12 carbon atoms and from 0.05 to 20 mol % of a diene.

DETAILED DESCRIPTION OF THE INVENTION

The present invention relates to an olefin resin-based article having good gas barrier properties comprising a crystalline olefin copolymer having formed thereon an inorganic metal oxide thin layer, wherein the crystalline olefin copolymer comprises repeat units obtained from ethylene or an α-olefin having 3 to 12 carbon atoms and from 0.05 to 20 mol % of a diene.

The crystalline olefin copolymer having a crystallinity of at least 1%, preferably from 20 to 70% (as measured by X-ray means), which can be used as a base material is a copolymer comprising ethylene or an α-olefin having from 3 to 12 carbon atoms and a diene having from 4 to 20 carbon atoms and having a diene unit content of from 0.05 to 20 mol %, preferably from 1 to 10 mol %.

The unsaturated copolymer should have a number average molecular weight, $M_N$, of at least 3,000, preferably at least 5,000. The copolymer of the present invention has either a melting point or a glass transition temperature no lower than 40° C., preferably between 80° and 187° C., and more preferably between 120° and 174° C.

One of the monomer components of the olefin copolymer is ethylene or an α-olefin having 3 to 12 carbon atoms, such as propylene, 1-butene, 1-hexene, 3-methyl-1butene, 3-methyl-1-pentene, 4-methyl-1-pentene, 3,3-dimethyl-1butene, 4,4-dimethyl-1-pentene, 3-methyl-1-hexene, 4-methyl-1-hexene, 4,4-dimethyl-1-hexene, 5-methyl1-hexene, allylcyclopentane, allylcyclohexane, allylbenzene 3-cyclohexyl-1-butene, vinylcyclopropane, vinylcyclohexane, and 2-vinylbicyclo[2,2,1]heptane. Preferred monomers are ethylene, propylene, 1-butene, 1hexene, 3-methyl-1-butene, 3-methyl-1-pentene, 4-methyl-1pentene, and 3-methyl1hexene, with ethylene, propylene, 1-butene, 4-methyl-1-pentene and 3-methyl-1-butene being most preferred.

Ethylene and the α-olefins may be used either individually or in combination of two or more thereof. In particular, propylene or a combination of propylene with at least one other monomer from the group of ethylene, 1butene, 4-methyl-1-pentene, and 3-methyl-1-butene is preferred, with the total content of the monomers other than propylene being no more than 5 mol %. When the amount of the other comonomers exceeds 5 mol %, the resulting copolymer exhibits undesirable rubbery properties. When two or more α-olefins are incorporated into the copolymer of the present invention, the α-olefins may be distributed randomly or in blocks.

The diene monomers which can be copolymerized with the above-mentioned olefin monomers include conjugated dienes, acyclic or cyclic non-conjugated dienes and mixtures thereof, each having from 4 to 20 carbon atoms, preferably from 4 to 14 carbon atoms.

Examples of conjugated dienes include 1,3-dienes, such as 1,3-butadiene, isoprene, 1,3-pentadiene, 1,3-hexadiene, 2,4-hexadiene, 2-methyl-1,3-pentadiene, 3-methyl-1,3-pentadiene, 4-methyl-1,3-pentadiene, 2,3-dimethyl-1,3-butadiene, 2,4-heptadiene, 3,4-dimethyl-1,3pentadiene, 4-methyl-1,3-hexadiene, 5-methyl-1,3-hexadiene, 2,4-dimethyl-1,3-pentadiene, 4-ethyl-1,3-hexadiene, 7-methyl-3-methylene-1,6-octadiene (myrcene), 1,3-butadiene, 4-phenyl-1,3-pentadiene, and 1,4-diphenyl-1,3butadiene; and dialkenylbenzenes, such as divinylbenzene, isopropenylstyrene, divinyltoluene, divinylnaphthalene, and 1-phenyl-1-(4-vinylphenyl)ethylene.

The acyclic non-conjugated dienes useful in the present invention may be any acyclic non-conjugated diene which is copolymerizable with the olefin component(s) of the copolymer. Suitable acyclic non-conjugated dienes include those represented by formula (I):

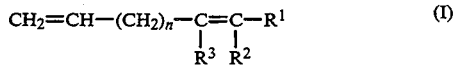

$$CH_2=CH-(CH_2)_n-\underset{R^3}{C}=\underset{R^2}{C}-R^1 \quad (I)$$

wherein n represents an integer of from 1 to 10; and $R^1$, $R^2$, and $R^3$ each, independently, represents hydrogen or an alkyl group having from 1 to 8 carbon atoms Preferred acyclic non-conjugated dienes of formula (I) are those wherein n is 1 to 5; and $R^1$, $R^2$, and $R^3$ are each, independently, hydrogen or an alkyl group having from 1 to 4 carbon atoms, provided that $R^1$, $R^2$, and $R^3$ do no simultaneously represent hydrogen. More preferred acyclic non-conjugated dienes of formula (I) are those wherein n is 1 to 3 carbon atoms; and $R^1$ and $R^3$ are each, independently, hydrogen or an alkyl group having 1 to 3 carbon atoms, provided that $R^2$ and $R^3$ do not simultaneously represent hydrogen.

Specific examples of such acyclic non-conjugated dienes include acyclic 1,4-dienes, such as 2-methyl-1,4pentadiene, 4-methylidene-1-hexane, 1,4-hexadiene, 4-methyl-1,4-hexadiene, 5-methyl-1,4-hexadiene, 1,4-heptadiene, 4-ethyl-1,4-hexadiene, 4,5-dimethyl-1,4-hexadiene, 4-methyl-1,4-heptadiene, 4-ethyl-1,4-heptadiene, 5-methyl-1,4-heptadiene, and 5-methyl-1,4-octadiene; acyclic 1,5-dienes, such as 1,5-heptadiene, 1,5-octadiene, 5-methyl-1,5-heptadiene, 6-methyl-1,5-heptadiene, and 2-methyl-1,5-hexadiene; acyclic 1,6-dienes, such as 1,6-octadiene, 6-methyl-1,6-octadiene, 7-methyl-1,6-octadiene, 2-methyl-1,6-heptadiene, 6-methylidene1octene, 6-ethyl-1,6-octadiene, 6,7-dimethyl-1,6-octadiene, 1,6-nonadiene, 6-ethyl-1,6-nonadiene, 7-methyl-1,6-nonadiene, and 7-methyl-1,6-decadiene; acyclic 1,7-dienes, such as 1,7nonadiene, 7-methyl-1,7-nonadiene, 8-methyl-1,7-nonadiene, and 2-methyl-1,7-octadiene; and acyclic 1,8-dienes, such as 8-methyl-1,8-decadiene and 9-methyl-1,8-decadiene.

Suitable cyclic non-conjugated dienes include alkenylnorbornenes, such as cyclohexadiene, dicyclopentadiene, methyltetrahydroindene, and 5-vinyl-2-norbornene; alkylidenenorbornenes, such as 5-ethylidene-2-norbornene, 5-methylene-2-norbornene, and 5-isopropylidene-2-norbornene; and alkenylcyclohexenes, such as 6-chloro-methyl-5-isopropenyl-2-norbornene, norbornadiene, and 4-vinylcyclohexene.

Preferred dienes for use in the copolymer of the present invention are acyclic non-conjugated dienes and dialkenylbenzenes, with 4-methyl-1,4-hexadiene, 5-methyl-1,4-hexadiene, 6-methyl-1,6-octadiene, 7-methyl-1,6-octadiene, 1,9-octadiene, 1,13-tetradecadiene, isopropenylstyrene, and divinylbenzene being most preferred. When the article of the present invention is to be used as a packaging film for pouch-packed foods, 1,9-octadiene and 1,13-tetradecadiene are preferred because of their superior thermal stability characteristics.

The diene monomers may be incorporated into the copolymer of the present invention either individually or in combinations of two or more thereof. For example, a combination of 4-methyl-1,4-hexadiene and 5-methyl-1,4-hexadiene in a weight ratio of from 95:5 to 5:95 may be suitably used. Commercially available crude divinylbenzene, which is actually an isomeric mixture of m-divinylbenzene, p-divinylbenzene, ethylvinylbenzene, diethylbenzene, and other impurities, may be utilized without purification.

The crystalline olefin copolymer can be prepared by copolymerizing ethylene or an α-olefin and a diene in the presence of a conventional Ziegler-Natta catalyst used in α-olefin polymerization. Additionally, conventional olefin polymerization techniques and apparatus can be used to prepare the copolymers of the present invention.

The diene compound may be distributed in the olefin copolymer resin either at random or in blocks.

The concentration of the repeating unit obtained from the diene monomer (herein referred to as diene unit content) in the olefin copolymer resin ranges from 0.05 to 20 mol %, preferably from 0.5 to 15 mol %, and more preferably from 1 to 10 mol %. When the diene unit content is less than 0.05 mol %, the unreacted double bond content of the crystalline olefin copolymer resin is insufficient to obtain adequate adhesion to a deposited inorganic oxide layer. If the unreacted double bond content exceeds 20 mol %, the resulting crystalline olefin copolymer has reduced bending strength and reduced transparency.

The number average molecular weight of the crystalline olefin copolymer must be sufficient to maintain a resinous state as previously described. For example, the molecular weight of a copolymer comprising predominantly propylene as an α-olefin sufficient to maintain a resinous state, corresponds to a melt flow rate (MFR) of from 0.01 to 100 g/10 min, and preferably from 0.02 to 50 g/10 min, as measured in accordance with JIS K 6758 (230° C., 2.16 kg load). Such an olefin copolymer resin has a modulus of elasticity of from 800 to 45,000 kg/cm$^2$, and preferably from 1,000 to 35,000 kg/cm$^2$, as measured in accordance with JIS K 7203.

The preferred types of olefin copolymer resin are divided, on the basis of molecular structure, into (1) random copolymers comprising repeat units obtained from one or more monomers selected from ethylene and the α-olefins and one or more dienes, (2) block copolymers comprising polymer blocks of repeat units obtained from one or more monomers selected from ethylene and the α-olefins and random copolymer blocks comprising repeat units obtained from one or more monomers selected from ethylene and the α-olefins and one or more dienes (the monomer identities of the ethylene or α-olefins in the ethylene or α-olefin polymer blocks and their proportions may be the same as or different from those of the ethylene or α-olefins in the random copolymer blocks), and (3) block copolymers comprising random copolymer blocks comprising repeat units obtained from one or more monomers selected from ethylene and the α-olefins and one or more dienes (hereafter referred to as block a) and random copolymer blocks comprising repeat units obtained from one or more monomers selected from ethylene and the α-olefins and one or more dienes (hereinafter referred to as block b), blocks a and b differing in at least one of the monomer identities, number of monomers, and proportions of monomers of the ethylene or α-olefins and the monomer identities, number of monomers, and proportions of monomers of the dienes.

The terminology "block copolymer" as used herein has the following meanings:

(1) A "block copolymer comprising homopolymer blocks of monomer A and random copolymer blocks of monomer A and monomer B" includes not only a block copolymer built up through chemical bonding of homopolymer blocks of monomer A and random copolymer blocks of monomers A and B to form a structure of A. . . AAABABAAAAB . . . but a blend of polymers containing (i) a copolymer built up through chemical bonding of homopolymer blocks of monomer A and random copolymer blocks of monomers A and B and (ii) a homopolymer of monomer A or (iii) a random copolymer of monomers A and B or a combination of (ii) and (iii).

(2) A "block copolymer comprising polymer blocks a and b" includes not only polymers with blocks a and b chemically bonded to each other but a polymer blend containing (i) a block copolymer comprising chemically bound polymer blocks a and b, and (ii) a polymer solely comprising polymer blocks a and/or (iii) a polymer solely comprising polymer blocks b.

Therefore the terminology "block copolymer" has the same general meaning as when referring to polymers synthesized with a Ziegler-Natta catalyst.

Specific and preferred examples of the crystalline olefin copolymer include (1) a propylene/4-methyl-1,4hexadiene/5-methyl-1,4-hexadiene random copolymer, (2) a block copolymer comprising propylene homopolymer blocks and ethylene/4-methyl-1,4-hexadiene/5-methyl-1,4,hexadiene random copolymer blocks, (3) an ethylene/4-methyl-1,4-hexadiene/5-methyl-1,4-hexadiene random copolymer, (4) a propylene/ethylene/4-methyl-1,4-hexadiene/5-methyl-1,4-hexadiene random copolymer, (5) a block copolymer comprising ethylene/4-methyl-1,4-hexadiene/5-methyl-1,4-hexadiene random copolymer blocks and propylene/4-methyl-1,4-hexadiene/5-methyl-1,4-hexadiene random copolymer blocks, (6) a propylene/7-methyl-1,6-octadiene random copolymer, (7) a block copolymer comprising propylene homopolymer blocks and ethylene/propylene/7-methyl-1,6-octadiene random copolymer blocks, (8) a block copolymer comprising propylene homopolymer blocks and propylene/7-methyl-1,6-octadiene random copolymer blocks, (9) an ethylene/propylene/7-methyl-1,6-octadiene random copolymer, (10) a block copolymer comprising ethylene/propylene random copolymer blocks and propylene/7-methyl1,6-octadiene random copolymer blocks, (11) a block copolymer comprising ethylene/propylene random copolymer blocks and ethylene/propylene/7-methyl-1,6-octadiene random copolymer blocks, (12) a 3-methyl1-butene/7-methyl-1,6-octadiene random copolymer, (13) a propylene/divinylbenzene random copolymer, (14) an ethylene/divinylbenzene random copolymer, (15) a propylene/ethylene/divinylbenzene random copolymer, (16) a block copolymer comprising propylene homopolymer blocks and ethylene/divinylbenzene random copolymer blocks, (17) a block copolymer comprising propylene homopolymer blocks and propylene/ethylene/divinylbenzene random copolymer blocks, (18) a block copolymer comprising propylene/divinylbenzene random copolymer blocks and ethylene/divinylbenzene random copolymer blocks, (19) a block copolymer comprising propylene/divinylbenzene random copolymer blocks and propylene/ethylene/divinylbenzene random copolymer blocks, and (20) a 3-methyl-1-butene/divinylbenzene random copolymer.

The crystalline olefin copolymer of the present invention may be diluted with polypropylene, polyethylene, a propylene/ethylene copolymer, an ethylene/butene-1 copolymer, an ethylene/octene-1 copolymer, an ethylene/ hexane-1 copolymer, a propylene/butene-1 copolymer, a propylene/ethylene/butene-1 copolymer, a propylene/4-methylpentene-1 copolymer, or similar polymers. However, in diluting the copolymer the resultant resin mixture should contain from $1 \times 10^{-4}$ to $2 \times 10^{-2}$ carbon-to-carbon double bonds per 100 g of the total resin content.

Articles which can be formed from the crystalline olefin copolymer include films, sheets, containers, and cases. These articles may be obtained by conventional processes, such as extrusion, injection molding, vacuum forming, and blow molding. The molded articles may have a laminate structure composed of the crystalline olefin copolymer and a thermoplastic resin, such as polyethylene, polypropylene, an ethylene-vinyl acetate copolymer, polyamide, polybutylene terephthalate, polyethylene terephthalate, polyphenylene sulfide, polyphenylene ether, polycarbonate, polyvinylidene chloride, polyvinylidene fluoride, and polyethylvinyl alcohol. The films or sheets may be subjected to stretching.

The films preferably have a thickness of from 5 to 200 μm. The sheets preferably have a thickness of from 200 to 1,500 μm. Small containers or cases preferably have a wall thickness of from 300 to 2,500 μm. Tanks or 20 l-volume chemical storage vessels preferably have a wall thickness of from 1 to 10 mm.

If desired, the molded articles may be subjected to an oxidation treatment, such as a corona discharge treatment, an ozone treatment, a glow discharge treatment, a plasma treatment, or a treatment with a chemical. However, since, in many cases, subsequent deposition of an inorganic oxide is usually accompanied by such an oxidation treatment, there is no particular need of such an oxidation treatment during or after molding.

The inorganic oxide thin layer can be any metal oxide thin layer. Suitable oxides include deposits of $SiO_x$, $SnO_x$, $ZnO_x$, or $IrO_x$ wherein x is a number from 1 to 2. The deposit thickness may be any thickness which provides sufficient transparency, deposition rate, gas barrier properties and take-up properties of the film, with thicknesses of from 200 to 4,000 Å being preferred and from 300 to 3,000 Å being more preferred.

Deposition methods include a method in which an inorganic oxide is deposited on a molded article in vacuo ($1 \times 10^{-3}$ to $1 \times 10^{-6}$ Torr) in a vacuum deposition apparatus utilizing radiofrequency induction heating system (see JP-B-53-12953) and a method in which a gas stream containing an organosilicone compound, oxygen and an inert gas is generated in a vacuum deposition apparatus previously evacuated and a plasma is then generated in the gas stream by a magnetron glow discharge, depositing $SiO_x$ on a molded article in the vacuum deposition apparatus (see JP-A-64-87772 and U.S. Pat. Nos. 4,557,946 and 4,599,678). Additionally, various deposition methods which may be used in the preparation of the article of the present invention are described in KOGYO ZAIRYO, Vol. 38, No. 14, pp. 104–105 (November, 1990) under the classifications of ion plating, high-frequency plasma CVD, electron beam (EB) deposition, and sputtering.

Having generally described this invention, a further understanding can be obtained by reference to certain specific examples which are provided herein for purposes of illustration only and are not intended to be limiting unless otherwise specified. All the percents are by weight unless otherwise specified.

SYNTHESIS EXAMPLE

Preparation of Catalyst-on-Carrier:

In a flask thoroughly purged with nitrogen was put 100 ml of dehydrated and deoxidized n-heptane, and 0.1 mol of magnesium chloride and 0.20 mol of titanium tetrabutoxide were added thereto, followed by allowing the mixture to react at 100° C. for 2 hours. The temperature was lowered to 40° C., and 15 ml of methyl hydrogen polysiloxane was added thereto and reacted for 3 hours. After completion of the reaction, the solid component produced was washed with n-heptane. Composition analysis on an aliquot of the solid component revealed a Ti content of 15.2% and an Mg content of 4.2%.

In a flask thoroughly purged with nitrogen was charged 100 ml of dehydrated and deoxidized n-heptane, and 0.03 mol of the above-prepared solid component was added thereto. To the flask was further introduced 0.05 mol of silicon tetrachloride at 30° C. over a period of 15 minutes, and the mixture was allowed to react at 90° C. for 2 hours. After completion of the reaction, the reaction mixture was washed with purified n-heptane. A mixture of 25 ml of n-heptane and 0.004 mol of $o\text{-}C_6H_4(COCl)_2$ was added to the reaction mixture at 50° C. and 0.05 mol of silicon tetrachloride was then added thereto, followed by allowing the mixture to react at 90° C. for 2 hours. After complexion of the reaction, the reaction mixture was washed with n-heptane to obtain a catalyst component having a Ti content of 2.05%.

Preparation of Olefin Copolymer (1):

In a 10 l autoclave thoroughly purged with propylene were charged 3.3 l of n-heptane, and 1.0 g of triethylaluminum, 0.44 g of diphenyldimethoxysilane, and 0.7 g of the above-prepared catalyst-on-carrier were added thereto in this order. To the autoclave was fed 800 ml of hydrogen, and propylene was then introduced under pressure to an inner pressure of 0.5 kg/cm²G. The mixture was stirred at 50° C. at that pressure. Thereafter, 1200 ml of 1,4-hexadiene was added thereto, the temperature was elevated while introducing propylene under pressure to an inner pressure of 5.5 kg/cm²G, and the mixture was kept at 65° C. under that pressure for 5 hours to conduct polymerization. The catalyst was inactivated with n-butanol, the residual catalyst was extracted with water, and the copolymer was recovered by centrifugation and dried to obtain 1940 g a dry powder having a bulk density of 0.50 g/cc and an amorphous polymer content of 54 g. The copolymer had an MFR (230° C., 2.16 kg load; hereinafter the same) of 2 g/10 min, a density of 0.895 g/cm³, crystallinity of 37%, and a modulus of elasticity of 5,500 kg/cm². The 1,4-hexadiene unit content was 3.3 mol % as analyzed by $H^1$-NMR, and had a 1,2-addition structure.

Preparation of Olefin Copolymer (2):

A random copolymer comprising 99.95 mol % of propylene and 0.05 mol % of 1,4-hexadiene was prepared in the same manner as the olefin copolymer (1), except for changing the amount of 1,4-hexadiene. Olefin copolymer (2) had an MFR of 2 g/10 min, a density of 0.903 g/cm³, a crystallinity of 60%, and a modulus of elasticity of 11,000 kg/cm².

Preparation of Olefin Copolymer (3):

A random copolymer comprising 99.99 mol % of propylene and 0.01 mol % of 1,4-hexadiene was prepared in the same manner as for olefin copolymer (1), except for changing the amount of 1,4-hexadiene. Olefin copolymer (3) had an MFR of 2 g/10 min, a density of 0.904 g/cm³, a crystallinity of 67%, and a modulus of elasticity of 12,000 kg/cm².

Preparation of Olefin Copolymer (4):

A random copolymer comprising 90.0 mol % of propylene and 10 mol % of 1,4-hexadiene was prepared in the same manner as for olefin copolymer (1), except for changing the amount of 1,4-hexadiene. Olefin copolymer (4) had an MFR of 2 g/10 min, a density of 0.904 g/cm³ crystallinity of 21%, and a modulus of elasticity of 1,000 kg/cm².

Preparation of Olefin Copolymer (5):

In a 10 l autoclave thoroughly purged with propylene were charged 3.3 l of n-heptane, and 1.0 g of triethylaluminum, 10.44 g of diphenyldimethoxysilane, and 0.7 g of the above-prepared catalyst-on-carrier were added thereto in this order. To the autoclave was fed 800 Nml of hydrogen, and propylene was then introduced under pressure to an inner pressure of 0.5 kg/cm²G. The mixture was stirred at 50° C. at that pressure. Thereafter, 750 ml of 7-methyl-1,6-octadiene was added to the reaction mixture, the temperature was elevated while introducing propylene under pressure to an inner pressure of 5.5 kg/cm²G, and the mixture was kept at 65° C. under that pressure for 5 hours to conduct polymerization. The catalyst was inactivated with n-butanol, the residual catalyst was extracted with water, and the copolymer produced was recovered by centrifugation and dried to obtain 1940 g a dry powder having a bulk density of 0.50 g/cc and an amorphous polymer content of 54 g. Copolymer (5) had an MFR of 1.4 g/10 min, a crystallinity of 42%, and a modulus of elasticity of 8,100 kg/cm² and showed a melting peak at 149° C. in DSC measurement. The 7-methyl-1,6-octadiene unit content was 2.7 mol % as analyzed by $H^1$-NMR, and had a 1,2-addition structure.

EXAMPLE 1

Olefin copolymer (1) (propylene content: 96.7 mol %; 1,4-hexadiene content: 3.3 mol %) was melt-kneaded in an extruder at 230° C. and extruded through a T-die at 220° C. The extruded sheet was cooled on a metallic roll to obtain a 1 mm thick sheet.

The sheet was heated to 120° C. and stretched 5-fold in the longitudinal direction (or machine direction) by making use of a difference in the peripheral speed of rolls.

The stretched film was then re-heated to 151° C. in a tentering oven and 10-fold stretched in the cross (or transverse) direction using a tenter frame. The biaxially stretched film was subjected to annealing at 167° C. and then to a corona discharge treatment to obtain a biaxially stretched film having a thickness of 20 μm (haze: 2.5%).

The biaxially stretched film was placed in a plasma deposition apparatus. After evacuating the apparatus to $1\times10^{-6}$ Torr, a mixed gas consisting of 35 parts by volume of hexamethyldisiloxane, 35 parts by volume of oxygen, 46 parts by volume of helium, and 35 parts by volume of argon was introduced into the apparatus and subjected to a glow discharge by a non-equilibrium magnetron to generate plasma. A $SiO_2$ thin layer was thus deposited on the biaxially stretched film to a thickness of 1,000 Å. The discharge conditions were set so that the $SiO_2$-deposited film might have an oxygen permeability of 5.0 cc/m².atm.day as measured in accordance with JIS 1707-75.

COMPARATIVE EXAMPLE 1

An $SiO_2$-deposited biaxially stretched film (deposit thickness: 1,000 Å) was prepared in the same manner as in Example 1, except for replacing the propylene/1,4-hexadiene random copolymer with a propylene homopolymer (MFR: 2.0 g/10 min; density: 0.905 g/cm³; melting point: 167° C.).

EXAMPLE 2

Olefin copolymer (1) (referred to as A) and the same propylene homopolymer as used in Comparative Example 1 (referred to as B) were melt-kneaded in separate extruders at 230° C., fed to one die, laminated together in the die, and co-extruded at 220° C. to obtain a 1 mm thick sheet.

The sheet was stretched in the same manner as in Example 1 to obtain a biaxially stretched film composed of 2 μm thick layer (A) and 18 μm thick layer (B).

The layer (A) side of the laminate film was subjected to a corona discharge treatment, and $SiO_2$ was deposited thereon to a deposit thickness of 1,000 Å in the same manner as in Example 1.

EXAMPLES 3 TO 5 AND COMPARATIVE EXAMPLE 2

An $SiO_2$-deposited stretched film was prepared in the same manner as in Example 1, except for replacing olefin copolymer (1) with olefin copolymer (2) (Example 3), olefin copolymer (3) (Comparative Example 2), olefin copolymer(4) (Example 4) or olefin copolymer (5) (Example 5).

The glow discharge conditions were varied for each stretched film so that all the stretched films might have an oxygen permeation of 5.0 cc/m².atm.day.

Each of the $SiO_2$-deposited stretched films obtained in Examples 1 to 5 and Comparative Examples 1 to 2 was evaluated as follows. The results of evaluation are shown in Table 1 below.

1 Permeation Change with External Stress:

A repeated torsion tester "Gelbo Flex Tester" manufactured by Meiritsu Keiki K.K. (Military specifications: MIL B 132) was used. The film was rolled into a cylindrical form, and the ends of the cylinder, in the longitudinal direction, were fixed to the clamps of the tester. Torsion from 0° to 440° was repeated ten times while compressing the cylinder in the longitudinal direction to ⅔ of its original length, and oxygen permeability was then determined.

2) Change on Fabrication:

Low-density polyethylene having a melt index of 5 (g/10 min) and a density of 0.922 g/cm³ was extruded from a T-die at a resin temperature of 320° C. into a 20 μm thick film and laminated on the $SiO_2$ deposit side of the film using a laminator. The oxygen permeability and haze of the resulting laminated film were measured.

TABLE 1

| Example No. | Diene Unit Content (mol %) | Initial | | After External Stress | After Laminating | |
|---|---|---|---|---|---|---|
| | | Oxygen Permeability (cc/g · m² · day) | Haze (%) | Oxygen Permeability (cc/g · m² · day) | Oxygen Permeability (cc/g · m² · day) | Haze (%) |
| Example 1 | 3.3 | 5.0 | 3.5 | 7.0 | 5.0 | 6.5 |
| Example 2* | 3.3 | 5.0 | 3.0 | 7.0 | 5.0 | 6.2 |
| Example 3 | 0.05 | 5.0 | 2.9 | 9.0 | 6.0 | 6.0 |
| Example 4 | 10 | 5.0 | 4.0 | 8.5 | 5.5 | 7.2 |
| Example 5 | 2.7 | 5.0 | 3.0 | 6.8 | 5.0 | 6.0 |
| Comparative Example 1 | 0 | 5.0 | 2.7 | 340 | 27 | 9.8 |
| Comparative Example 2 | 0.01 | 5.0 | 2.8 | 280 | 18 | 9.9 |

Note: *Laminated film.

As described and demonstrated above, the crystalline olefin copolymer molded article with an inorganic oxide deposit suffers no reduction in gas barrier properties even when heat or stress is applied thereto. Accordingly, it is more useful as a wrapping or packaging material in the production of pouch-packed foods, IC packages, and other devices requiring enhanced barrier protection.

Obviously, numerous modifications and variations of the present invention are possible in light of the above teachings. It is therefore to be understood that within the scope of the appended claims the invention may be practiced otherwise than as specifically described herein.

What is claimed is:

1. An olefin resin-based article having good gas barrier properties, comprising:
a crystalline olefin copolymer having formed thereon an inorganic metal oxide thin layer formed by plasma deposition, wherein said inorganic metal oxide thin layer has a thickness from 200 to 4,000 Å and wherein said inorganic metal oxide is $SiO_2$, wherein said crystalline olefin copolymer comprises repeat units obtained from ethylene or an α-olefin having 3 to 13 carbon atoms; and from 0.05 to 20 mol % of a diene.

2. The olefin resin-based article as claimed in claim 1, wherein said crystalline olefin copolymer has modulus of elasticity of from 800 to 45,000 kg/cm$^2$.

3. The olefin resin-based article as claimed in claim 1, wherein said crystalline olefin copolymer has a melt flow rate of from 0.01 to 100 g/10 min.

4. The olefin resin-based article as claimed in claim 1, wherein said crystalline olefin copolymer contains from $1 \times 10^{-4}$ to $2 \times 10^{-2}$ carbon-to-carbon double bonds per 100 g.

5. The olefin resin-based article as claimed in claim 1, wherein said crystalline olefin copolymer has a crystallinity of from 20 to 70%.

6. The olefin resin-based article as claimed in claim 1, wherein said α-olefin is propylene, and said diene is an acyclic, non-conjugated diene represented by formula

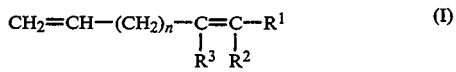
(I)

wherein n is a number form 1 to 10, and $R^1$, $R^2$, and $R^3$ each, independently, represents hydrogen, or an alkyl group having from 1 to 8 carbon atoms.

7. The olefin resin-based article as claimed in claim 6, wherein said diene is selected from the group consisting of 1,4-hexadiene, 4-methyl-1,4-hexadiene, 5-methyl-1,4hexadiene, 6-methyl-1,6-octadiene, 7-methyl-1,6-octadiene 1,9-octadiene, and 1,13-tetradecadiene.

8. The olefin resin-based article as claimed in claim 6, wherein said diene is selected from the group consisting of 1,9-octadiene and 1,13-tetradecadiene.

9. The olefin resin-based article as claimed in claim 1, wherein the article is a biaxially stretched film having a thickness of from 5 to 200 μm, and said inorganic oxide thin layer is SiO$_2$, having a thickness of from 200 to 4,000 Å.

10. The olefin resin-based article as claimed in claim 1, further comprising a layer of a thermoplastic resin laminated to said inorganic oxide layer or laminated to said crystalline olefin copolymer.

11. The olefin resin-based article as claimed in claim 10 wherein said thermoplastic resin is a member selected from the group consisting of polyethylene, polypropylene, ethylene-vinyl acetate copolymer, polyamide, polybutylene terephthalate, polyethylene terephthalate, polyphenylene sulfide, polyphenylene ether, polycarbonate, polyvinylidene chloride, polyvinylidene fluoride and polyethylvinyl alcohol.

* * * * *